US011276675B2

(12) United States Patent
He et al.

(10) Patent No.: US 11,276,675 B2
(45) Date of Patent: Mar. 15, 2022

(54) DISPLAY DEVICE HAVING DISPLAY SUB-PIXEL REGIONS AND BACKUP SUB-PIXEL REGIONS AND INCLUDING ANODES AND CATHODES, MANAFACTURING METHOD THEREOF, AND DISPLAY APPARATUS THEREOF

(71) Applicant: Xiamen Tianma Micro-Electronics Co., Ltd., Xiamen (CN)

(72) Inventors: Shui He, Xiamen (CN); Ming Yang, Shanghai (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 17/006,922

(22) Filed: Aug. 31, 2020

(65) Prior Publication Data
US 2020/0402966 A1  Dec. 24, 2020

(30) Foreign Application Priority Data
Jun. 18, 2020 (CN) .......................... 202010557829.7

(51) Int. Cl.
*H01L 27/14* (2006.01)
*H01L 29/04* (2006.01)
*H01L 29/15* (2006.01)
*H01L 31/036* (2006.01)
*H01L 25/16* (2006.01)

(52) U.S. Cl.
CPC .................................. *H01L 25/167* (2013.01)

(58) Field of Classification Search
CPC ... H01L 25/167; H01L 25/0753; H01L 33/62; H01L 27/156; H01L 33/48; H01L 2933/0033; H01L 2933/0066
See application file for complete search history.

(56) References Cited

U.S. PATENT DOCUMENTS

| 2008/0252581 A1* | 10/2008 | Brown Elliott ....... G02F 1/1368 345/88 |
| 2012/0293399 A1* | 11/2012 | Haskin .............. G02F 1/134309 345/88 |
| 2021/0209991 A1* | 7/2021 | Rugheimer .......... G09G 3/3233 |

* cited by examiner

*Primary Examiner* — Ismail A Muse
(74) *Attorney, Agent, or Firm* — Kilpatrick Townsend & Stockton, LLP

(57) ABSTRACT

A display panel includes an array substrate and light-emitting diodes including display light-emitting diodes. A display area includes sub-pixel regions including display sub-pixel regions and backup sub-pixel regions. In each of first and second directions, the display sub-pixel regions and the backup sub-pixel regions are arranged alternately. Display anode and cathode are provided in each display sub-pixel region. Backup anode and cathode are provided in at least one backup sub-pixel region. The display anode located in one display sub-pixel region is connected to the backup anodes of at least two backup sub-pixel region, and/or, at least two backup anodes provided in one backup sub-pixel region are electrically connected to the display anodes of at least two display sub-pixel regions, respectively. A positive pin of the display light-emitting diode is bonded to the display anode, and a negative pin thereof is bonded to the display cathode.

19 Claims, 16 Drawing Sheets

DISPLAY DEVICE HAVING DISPLAY SUB-PIXEL REGIONS AND BACKUP SUB-PIXEL REGIONS AND INCLUDING ANODES AND CATHODES, MANAFACTURING METHOD THEREOF, AND DISPLAY APPARATUS THEREOF

CROSS-REFERENCE TO RELATED APPLICATIONS

The present application claims priority to Chinese Patent Application No. 202010557829.7, filed on Jun. 18, 2020, the content of which is incorporated herein by reference in its entirety.

FIELD

The present disclosure relates to display technology, and more particularly, to a display panel and a manufacturing method thereof, and a display apparatus.

BACKGROUND

In the manufacturing process of light-emitting diode display panel, such as a micro LED display panel, it needs to transfer light-emitting diodes formed on a growth substrate to an array substrate by means of mass transfer technology. Since there are too many light-emitting diodes that need to be transferred, it is inevitable that there is a light-emitting diode incapable of emitting light due to the influence of the transferring success rate.

FIG. 1 is a schematic diagram of an arrangement of sub-pixel regions in the related art. As shown in FIG. 1, in the related art, rows of display sub-pixel regions 1' for bonding display light-emitting diodes and rows of backup sub-pixel regions 2' for bonding the backup light-emitting diodes are alternately arranged in a column direction. Each backup sub-pixel region 2' is provided with a backup anode and a backup cathode. When a display light-emitting diode bonded in a display sub-pixel regions 1' is broken, a backup light-emitting diode is bonded in the backup sub-pixel region 2' corresponding to the broken display sub-pixel regions 1' to compensate its emission brightness.

However, in practical applications, only a small number of backup sub-pixel regions 2' are provided with the backup light-emitting diodes, other backup sub-pixel regions 2' are not provided with the backup light-emitting diodes. Therefore, if the above arrangement is adopted, when the display panel emits light, a dark line appears in the area where the backup sub-pixel regions 2' is located, which affects the display effect.

SUMMARY

In one aspect, an embodiment of the present disclosure provides a display panel including an array substrate and a plurality of light-emitting diodes. The array substrate has a display area, the display area includes a plurality of sub-pixel regions, and the plurality of sub-pixel regions includes a plurality of display sub-pixel regions and a plurality of backup sub-pixel regions. In each one of a first direction and a second direction that intersect with each other, the plurality of display sub-pixel regions and the plurality of backup sub-pixel regions are arranged alternately. A display anode and a display cathode are provided in each of the plurality of display sub-pixel regions, and at least one backup anode and a backup cathode are provided in each of at least one of the plurality of backup sub-pixel regions. The display anode provided in each of at least one of the plurality of display sub-pixel regions is electrically connected to at least two backup anodes respectively provided in at least two of the plurality of backup sub-pixel regions, and/or the at least one backup anode includes at least two backup anodes electrically connected, in one-to-one correspondence, to at least two display anodes respectively located in at least two of the plurality of display sub-pixel regions.

In another aspect, an embodiment of the present disclosure provides a manufacturing method of a display panel, and the method includes the following steps:

forming an array substrate having a display area, where the display area includes a plurality of sub-pixel regions including a plurality of display sub-pixel regions and a plurality of backup sub-pixel regions, and the plurality of display sub-pixel regions and the plurality of backup sub-pixel regions are arranged alternately in both a first direction and a second direction that intersect with each other;

forming a display anode and a display cathode in each of the plurality of display sub-pixel regions, and forming at least one backup anode and a backup cathode in each of at least one of the plurality of backup sub-pixel regions, wherein the display anode provided in each of at least one of the plurality of display sub-pixel regions is electrically connected to at least two backup anodes respectively provided in at least two of the plurality of backup sub-pixel regions, and/or the at least one backup anode includes at least two backup anodes electrically connected, in one-to-one correspondence, to at least two display anodes respectively located in at least two of the plurality of display sub-pixel regions;

forming a plurality of display light-emitting diodes on a growth substrate;

transferring and bonding the plurality of display light-emitting diodes to the plurality of display sub-pixel regions, where each of the plurality of display light-emitting diodes includes a positive pin bonded to the display anode provided in one of the plurality of display sub-pixel regions and a negative pin bonded to the display cathode provided in the one of the plurality of display sub-pixel regions; and detecting whether at least one of the plurality of display light-emitting diodes is incapable of emitting light or not, and in response to detecting the at least one display light-emitting diode being incapable of emitting light, bonding a backup light-emitting diode to one backup anode of the at least one backup anode electrically connected to one of the at least one display light-emitting diode and the backup cathode corresponding to the one backup anode.

In yet another aspect, an embodiment of the present disclosure provides a display apparatus including a display panel. The display panel includes an array substrate and a plurality of light-emitting diodes. The array substrate has a display area, the display area includes a plurality of sub-pixel regions, and the plurality of sub-pixel regions includes a plurality of display sub-pixel regions and a plurality of backup sub-pixel regions. In each one of a first direction and a second direction that intersect with each other, the plurality of display sub-pixel regions and the plurality of backup sub-pixel regions are arranged alternately. A display anode and a display cathode are provided in each of the plurality of display sub-pixel regions, and at least one backup anode and a backup cathode are provided in each of at least one of the plurality of backup sub-pixel regions. The display anode provided in each of at least one of the plurality of display sub-pixel regions is electrically connected to at least two backup anodes respectively provided in at least two of the plurality of backup sub-pixel regions, and/or the at least one backup anode includes at least two backup anodes electrically connected, in one-to-one correspondence, to at least two display anodes respectively located in at least two of the plurality of display sub-pixel regions.

BRIEF DESCRIPTION OF DRAWINGS

Embodiments of the present disclosure are described in the accompanying drawings to be used in the description of the embodiments will be briefly described below. The drawings in the following description are merely some embodiments of the present disclosure.

DESCRIPTION OF EMBODIMENTS

Embodiments of the present disclosure will be described in detail as follows with reference to the accompanying drawings.

It should be noted that, the described embodiments are merely exemplary embodiments of the present disclosure, which shall not be interpreted as providing limitations to the present disclosure.

The terms used in the embodiments of the present disclosure are merely for the purpose of describing embodiments, rather than limiting the present disclosure. The singular form "a", "an", "the" and "said" used in the embodiments and claims shall be interpreted as also including the plural form, unless indicated otherwise in the context.

It should be understood that the term "and/or" used herein is merely an association relationship describing associated objects, indicating that there can be three relationships, for example, A and/or B can indicate that three cases, i.e., A alone, A and B, or B alone. In addition, the character "/" herein generally indicates that the related objects before and after the character form an "or" relationship.

Figure 1:
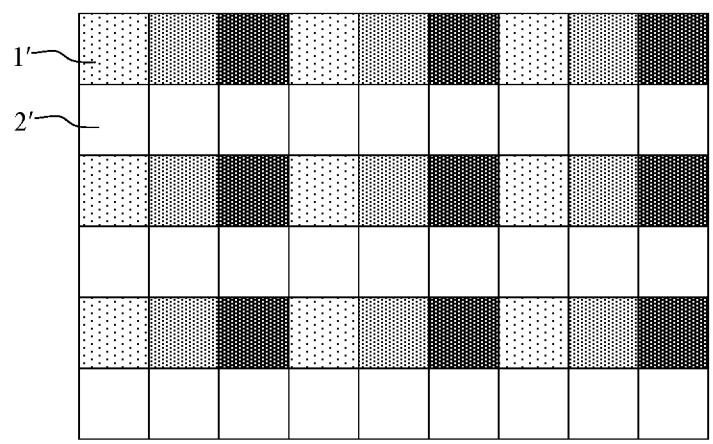
FIG. 1 is a schematic diagram showing an arrangement of sub-pixel regions in the related art.
Figure 2:
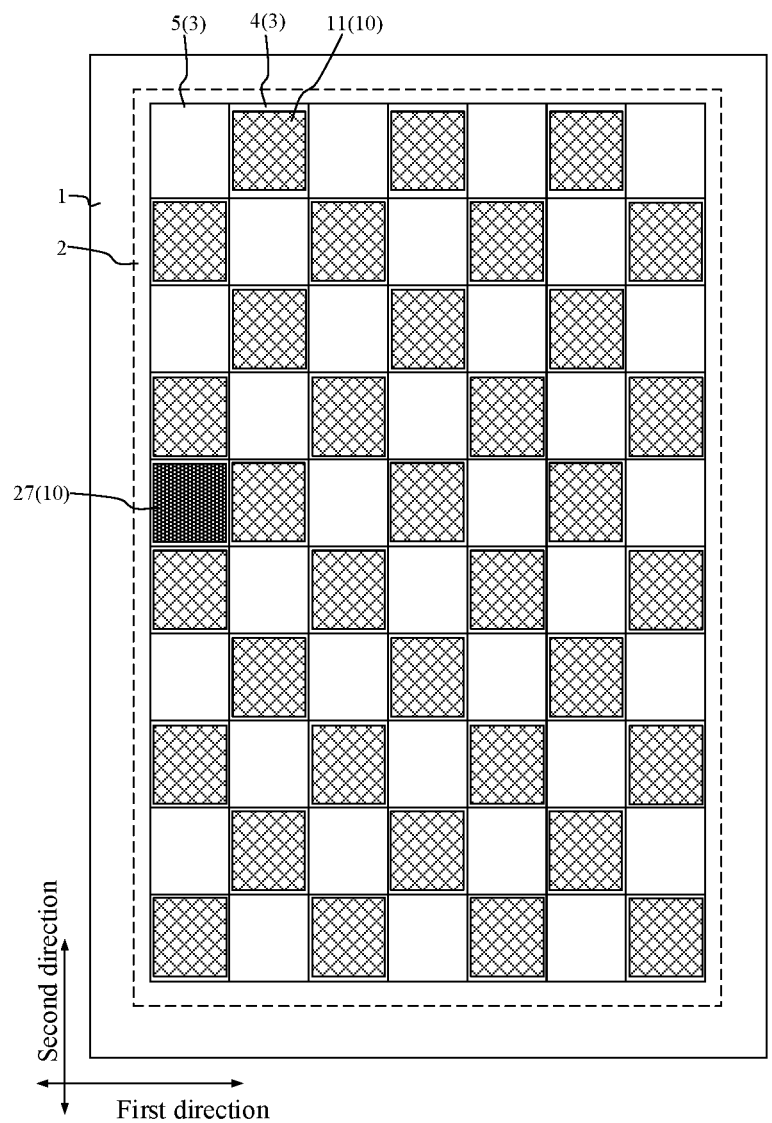
FIG. 2 is a top view of a display panel according to an embodiment of the present disclosure.
Figure 3:
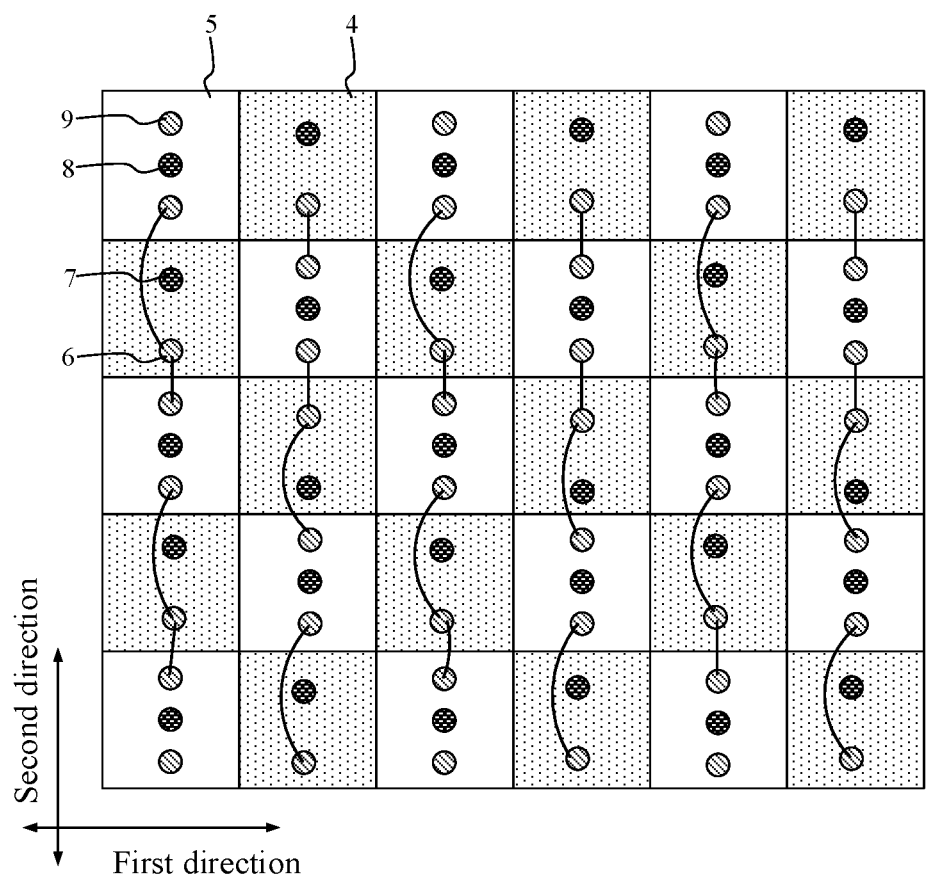
FIG. 3 is a schematic diagram showing an arrangement of sub-pixel regions according to an embodiment of the present disclosure.
Figure 4:
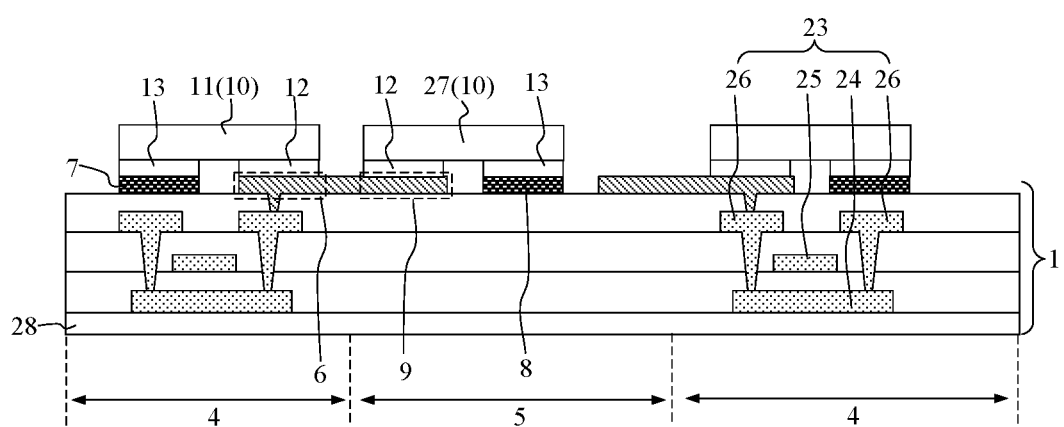
FIG. 4 is a cross-sectional view of display panel according to an embodiment of the present disclosure.

An embodiment of the present disclosure provides a display panel. FIG. 2 is a top view of a display panel according to an embodiment of the present disclosure. FIG. 3 is a schematic diagram showing an arrangement of sub-pixel regions according to an embodiment of the present disclosure. FIG. 4 is a cross-sectional view of display panel according to an embodiment of the present disclosure. As shown in FIG. 2 to FIG. 4, the display panel includes an array substrate 1, and a display area 2 of the display panel 1 includes a plurality of sub-pixel regions 3, and the plurality of sub-pixel regions 3 includes a plurality of display sub-pixel region 4 and a plurality of backup sub-pixel region 5. In any one of a first direction and a second direction, the display sub-pixel regions 4 and the backup sub-pixel regions 5 are arranged alternately, and the first direction intersects with the second direction.

A display anode 6 and a display cathode 7 are provided in the display sub-pixel region 4. At least one backup sub-pixel region 5 is provided with a backup anode 9 and a backup cathode 8. The display anode 6 in at least one display sub-pixel region 4 is electrically connected to the backup anodes 9 respectively located in at least two backup sub-pixel regions 5, and/or, at least two backup anodes 9 is provided in each of at least one backup sub-pixel regions 5, and the at least two backup anodes 9 are electrically connected, in one-to-one correspondence, to the display anodes 6 respectively located in at least two display sub-pixel regions.

The display panel further includes light-emitting diodes 10, and the light-emitting diodes 10 include a plurality of display light-emitting diodes 11. The display light-emitting diodes 11 are in one-to-one correspondence with the plurality of display sub-pixel regions 4. A positive pin 12 of the display light-emitting diode 11 is bonded to the display anode 6 located in a display sub-pixel region 4 corresponding to the display light-emitting diode 11, and a negative pin 13 of the display light-emitting diode 11 is bonded to the display cathode 7 located in the display sub-pixel region 4 corresponding to the display light-emitting diode 11. The light-emitting diode 10 can be a micro light-emitting diode, for example, Micro LED. The positive pin 12 of the light-emitting diode 10 is the N electrode or P electrode.

In an embodiment, one display anode 6 and one display cathode 7 are disposed in one display sub-pixel region 4 and form a bonding region for one display light-emitting diode 11. Only one backup cathode 8 is provided in the backup sub-pixel region 5. When one backup anode 9 is disposed in the backup sub-pixel region 5, the backup anode 9 and the backup cathode 8 form a bonding region for one backup light-emitting diode 27. When at least two backup anodes 9 are provided in the backup sub-pixel region 5, the backup cathode 8 serves as the common backup cathode of the at least two backup anodes 9. Each of the at least two backup anodes 9 and the backup cathode 8 constitute a bonding region for one backup light-emitting diode 27. After the display light-emitting diodes 11 are transferred and bonded to the array substrate 1, if it is detect that one display light-emitting diode 11 cannot emit light normally, the backup anode 9 that is electrically connected to the display anode 6 bonded to the display light-emitting diode 11 can be found, and then a new backup light-emitting diode 27 emitting light with the same color as the display light-emitting diode 11 is bonded in the backup sub-pixel region 5 where the backup anode 9 is located, and emission brightness of the display light-emitting diode 11 that cannot emit light is compensated.

In the display panel provided by embodiments of the present disclosure, firstly, based on the arrangement of the display sub-pixel regions 4 and the backup sub-pixel regions 5, in both the first direction and the second direction, a gap between two adjacent backup sub-pixel regions 5 is provided with the display sub-pixel region 4, and the backup sub-pixel regions 5 are spaced apart from each other in the display area 2, effectively improving a dark line caused by a continuous distribution of the backup sub-pixel regions 5, improving the display uniformity, and optimizing the display effect.

In addition, in an embodiment of the present disclosure, when the display anode 6 located in each of at least one of the display sub-pixel regions 4 is electrically connected to the backup anodes 9 located in at least two backup sub-pixel regions 5, the display light-emitting diode 11 bonded in the at least one of display sub-pixel regions 4 corresponds to at least two bonding regions for bonding the backup light-emitting diode 27. When one display light-emitting diode 11 cannot emit light, one bonding region can be selected from the bonding regions of the backup light-emitting diode 27 corresponding to the display light-emitting diode 11, to bond the backup light-emitting diode 27 therein; or a backup light-emitting diode 27 can be bonded in each of bonding regions of the backup light-emitting diode 27 corresponding to the display light-emitting diode 11, improving the selection feasibility of the bonding position of the backup light-emitting diode 27 and improving the reliability of the compensation of emission brightness of the display light-emitting diode 11 incapable of emitting light. Without increasing the space occupied by the backup regions, more backup schemes are provided for the backup light-emitting diode 27, and more backup regions for disposing the backup light-emitting diode 27 are provided.

In another embodiment, when at least two backup anodes 9 are provided in each of at least one of the backup sub-pixel regions 5 and the at least two backup anodes 9 are connected, in one-to-one correspondence, to the display anodes 6 located in at least two display sub-pixels, bonding regions for at least two backup light-emitting diodes 27 can be formed in each of the at least one of the backup sub-pixel regions 5. By adjusting the position of the backup light-emitting diode 27, one backup sub-pixel region 5 can selectively compensate any one of the at least two display light-emitting diodes 11, and thus the compensation manner is more flexible. In addition, the bonding regions of the at least two backup light-emitting diodes 27 commonly uses one backup cathode 8, reducing the quantity of the required backup cathodes and reducing the fabrication cost. Without increasing the space occupied by the backup regions, more backup schemes are provided for the backup light-emitting diode 27, and more candidate backup regions for disposing the backup light-emitting diode 27 are provided.

Figure 5:
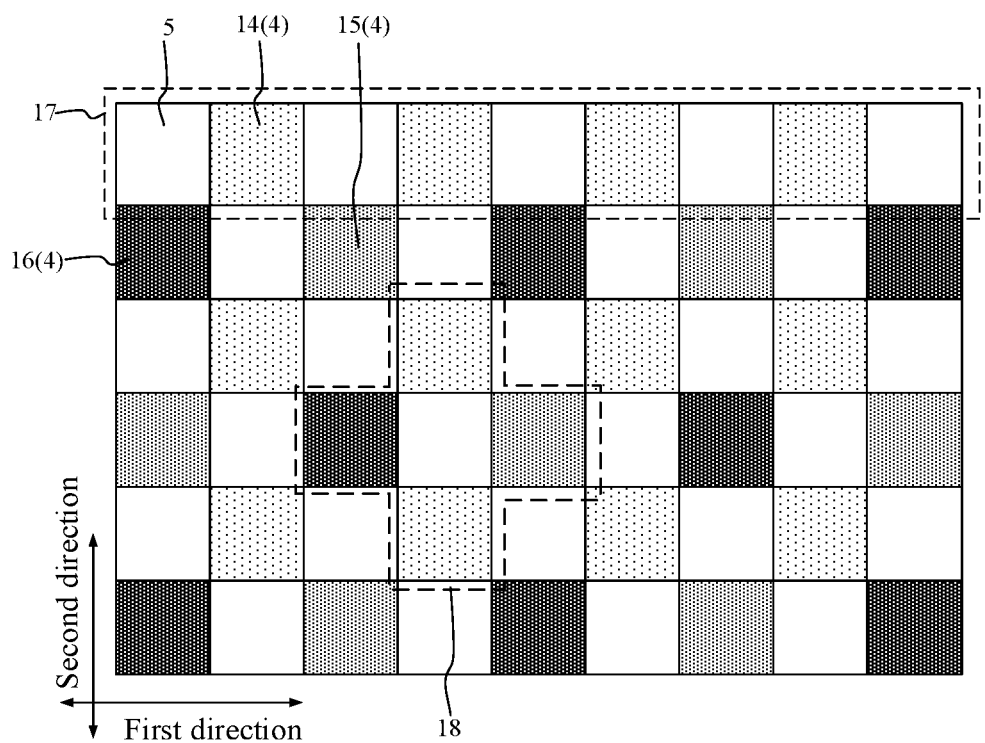
FIG. 5 is a schematic diagram showing another arrangement of the sub-pixel regions according to an embodiment of the present disclosure.

FIG. 5 is a schematic diagram showing another arrangement of the sub-pixel regions according to an embodiment of the present disclosure. In one or more embodiments, as shown in FIG. 5, the display sub-pixel regions 4 include red sub-pixel regions 14, green sub-pixel regions 15 and blue sub-pixel regions 16. The plurality of sub-pixel regions 3 constitute a plurality of sub-pixel region groups 17 arranged in the second direction. Each sub-pixel region group 17 includes multiple sub-pixel regions 3 arranged in the first direction. The red sub-pixel regions 14 are arranged in the $(2n-1)^{th}$ sub-pixel region group 17, and the green sub-pixel regions 15 and the blue sub-pixel regions 16 are alternately arranged in a $(2n)^{th}$ sub-pixel region group 17, and n is an integer greater or equal to 1. In the $(2n)^{th}$ sub-pixel region group 17 and the $(2n+2)^{th}$ sub-pixel region group 17, the green sub-pixel regions 15 can be arranged in the second direction in a staggered manner, or arranged in the second direction in an aligned manner.

In the above arrangement manner, two red sub-pixel regions 14, one green sub-pixel region 15 and one blue sub-pixel region 16 constitute one pixel region 18, and the display sub-pixel regions 4 in two adjacent pixel regions 18 can be reused. For example, two pixel regions 18 adjacent in the first direction can reuse a green sub-pixel region 15 or blue sub-pixel region 16, and two pixel regions 18 adjacent in the second direction can reuse a red sub-pixel region 14. In this way, the resolution is effectively improved without increasing the quantity of the display sub-pixel regions 4. In addition, in this arrangement manner, each pixel region includes two red sub-pixel regions 14. The light-emitting diode for emitting red light are affected by the characteristic of its light-emitting material and has a shorter service life than light-emitting diodes for emitting other color lights. Therefore, compared with the arrangement in which one pixel region includes only one red sub-pixel region 14 in related art, the emission brightness that should be offered by one red display light-emitting diode 11 is allocated to two red display light-emitting diodes 11 in this embodiment, and accordingly, the current density of each red display light-emitting diode 11 is reduced, improving the service life of the red display light-emitting diode 11 and further improving the service life uniformity of the various color display light-emitting diodes 11 in the display panel.

Figure 6:
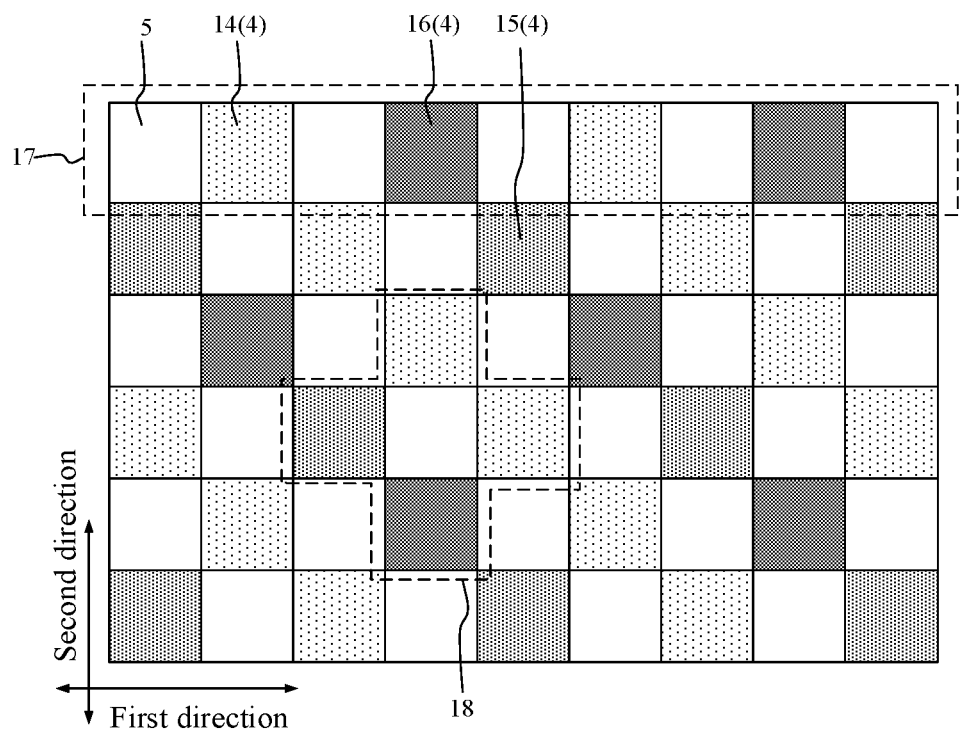
FIG. 6 is a schematic diagram showing yet another arrangement of the sub-pixel regions according to an embodiment of the present disclosure.

FIG. 6 is a schematic diagram showing yet another arrangement of the sub-pixel regions according to an embodiment of the present disclosure. In another embodiment, as shown in FIG. 6, the display sub-pixel regions 4 include red sub-pixel regions 14, green sub-pixel regions 15 and blue sub-pixel regions 16, and the plurality of sub-pixel regions 3 constitute a plurality of sub-pixel region groups 17 arranged in the second direction. Each sub-pixel region group 17 includes multiple sub-pixel regions 3. The red sub-pixel regions 14 and the blue sub-pixel regions 16 are alternately arranged in a $(2n-1)^{th}$ sub-pixel region group 17, the red sub-pixel regions 14 and the green sub-pixel regions 15 are alternately arranged in a $(2n)^{th}$ sub-pixel region group 17, and n is an integer greater or equal to 1. The red sub-pixel regions in the $(2n-1)^{th}$ sub-pixel region group 17 are aligned with the red sub-pixel regions in the $(2n+1)^{th}$ sub-pixel region group 17 in the second direction, and the red sub-pixel regions in the $(2n)^{th}$ sub-pixel region group 17 are aligned with the red sub-pixel regions in the $(2n+2)^{th}$ sub-pixel region group 17 in the second direction. In an embodiment, the red sub-pixel regions in the $(2n-1)^{th}$ sub-pixel region group 17 are staggered with the red sub-pixel regions in the $(2n+1)^{th}$ sub-pixel region group 17 in the second direction, and the red sub-pixel regions in the $(2n)^{th}$ sub-pixel region group 17 are staggered with the red sub-pixel regions in the $(2n+2)^{th}$ sub-pixel region group 17 in the second direction.

In the above arrangement manner, two red sub-pixel regions 14, one green sub-pixel region 15 and one blue sub-pixel region 16 constitute one pixel region 18, and the display sub-pixel region 4 in two adjacent pixel regions 18 can be reused. For example, two pixel regions 18 adjacent in the first direction can reuse a red sub-pixel region 14 or green sub-pixel region 15, and two pixel regions 18 adjacent in the second direction can reuse a red sub-pixel region 14 or blue sub-pixel region 16. In this way, the resolution is effectively improved without increasing the quantity of the display sub-pixel regions 4. In addition, in this arrangement manner, each pixel region includes two red sub-pixel regions 14. The emission brightness that is offered by one red display light-emitting diode 11 is allocated to two red display light-emitting diodes 11 in this embodiment, and accordingly, the current density of each red display light-emitting diode 11 is reduced, improving the service life of the red display light-emitting diode 11 and further improving the service life uniformity of the various color display light-emitting diodes 11 in the display panel.

Figure 7:
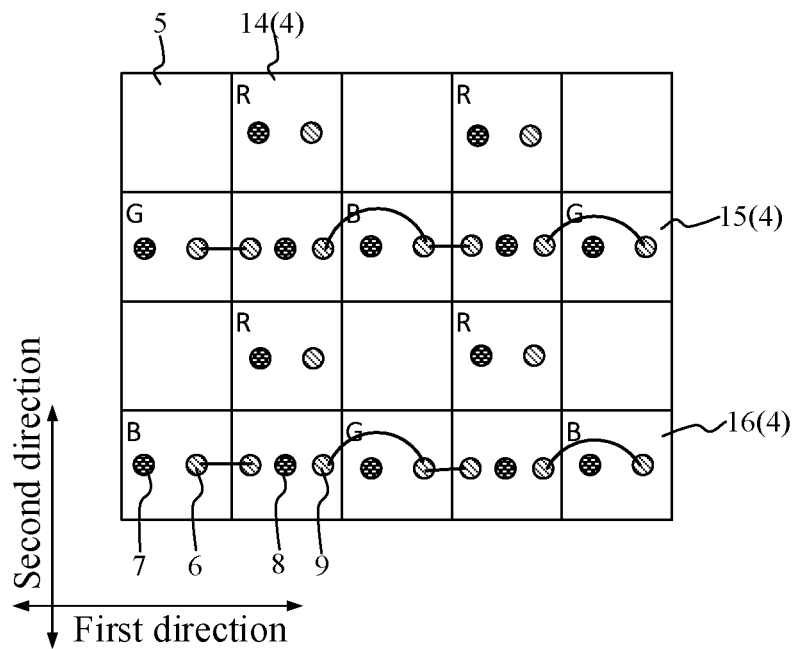
FIG. 7 is a schematic diagram showing connection of a display anode and a backup anode corresponding to FIG. 5.
Figure 8:
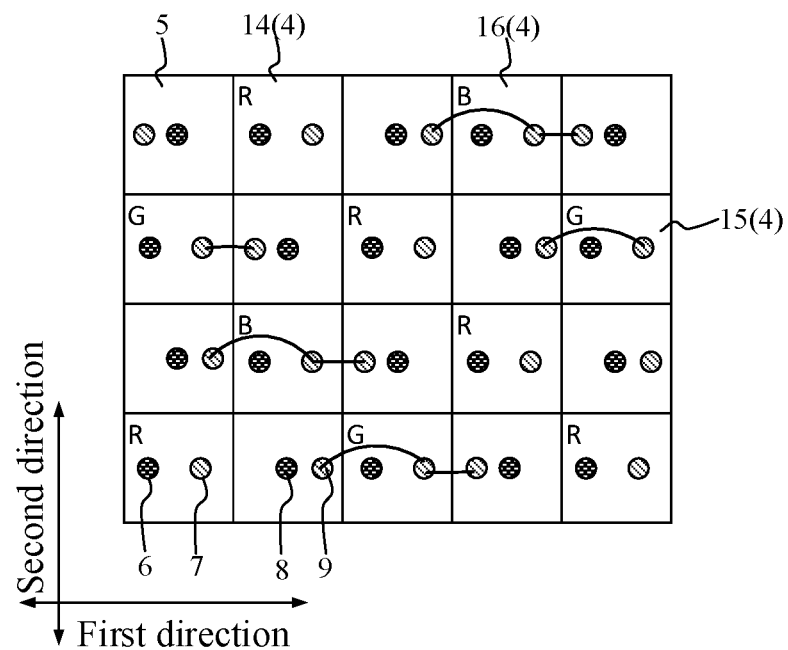
FIG. 8 is a schematic diagram showing connection of a display anode and a backup anode corresponding to FIG. 6.

In one or more embodiments, when the above two arrangement manners are adopted for the sub-pixel regions 3, in the display area 2, the quantity of the red sub-pixel regions 14 is about twice of the totally quantity of the green sub-pixel regions 15 and the blue sub-pixel regions 16. Therefore, when the display light-emitting diode 11 incapable of emitting light is a red display light-emitting diode 11, the loss of red emission brightness has little affecting on the overall luminance, and the affecting is almost negligible. FIG. 7 is a schematic diagram showing connection of a display anode and a backup anode corresponding to FIG. 5. FIG. 8 is a schematic diagram showing connection of a display anode and a backup anode corresponding to FIG. 6. In one or more embodiments, as shown in FIG. 7 and FIG. 8, the backup anode 9 is merely electrically connected to the display anodes 6 in the green sub-pixel region 15 and the blue sub-pixel region 16, so it is not necessary to arrange the backup anode 9 for bonding the backup red light-emitting diode 11, reducing the design complexity and reducing the manufacturing cost. Moreover, in order to reduce the length of the connection wire between the backup anode 9 and the display anode 6 and reduce the signal transmission loss and layout complexity, the backup anode 9 that is electrically connected to the display anode 6 of the green sub-pixel region 15 is located in the backup sub-pixel region 5 that is adjacent to the green sub-pixel region 15 in the first direction, and the backup anode 9 that is electrically connected to the display anode 6 of the blue sub-pixel region 16 is located in the backup sub-pixel region 5 that is adjacent to the blue sub-pixel region 16 in the first direction. Please referring to FIG. 8 again, in the backup sub-pixel region 5, only one bonding region for the backup light-emitting diode that emits green light or backup light-emitting diode that emits blue light is provided. Therefore, when the backup light-emitting diode is bonded in the backup sub-pixel region 5, crosstalk between signals also can be avoided.

Figure 9:
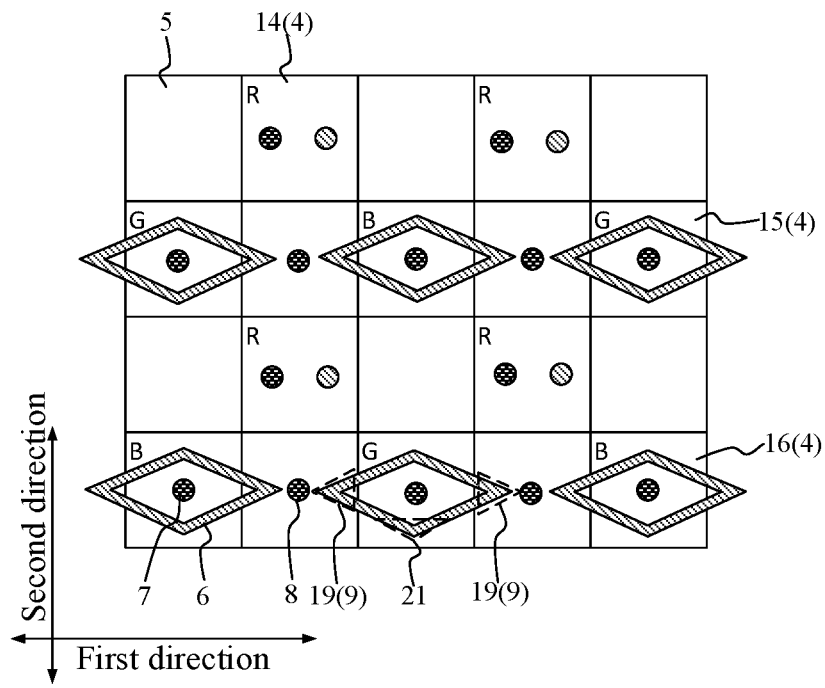
FIG. 9 is a schematic diagram of a display anode and a backup anode corresponding to FIG. 5.
Figure 10:
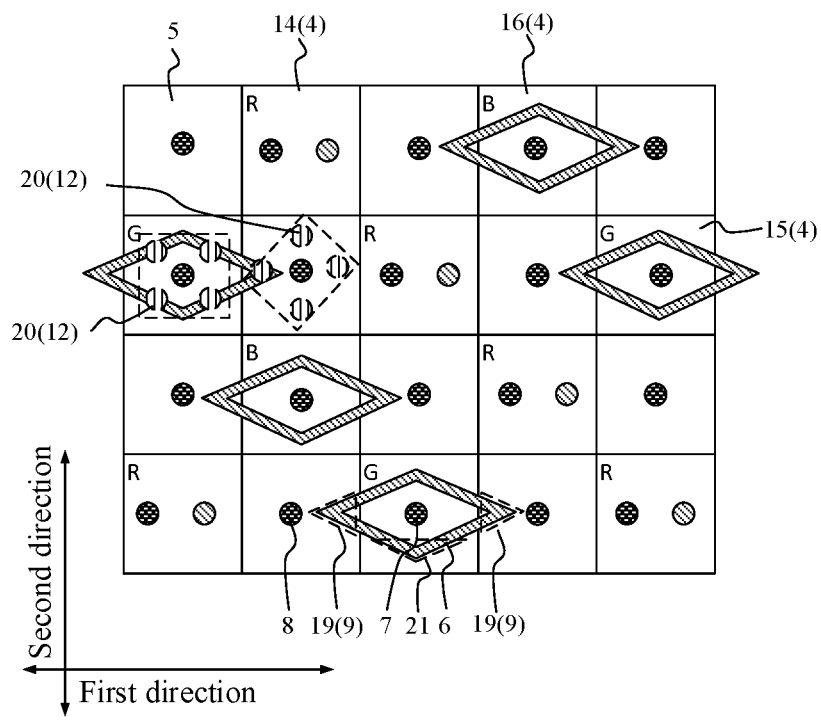
FIG. 10 is a schematic diagram of a display anode and a backup anode corresponding to FIG. 6.

FIG. 9 is a schematic diagram of a display anode and a backup anode corresponding to FIG. 5. FIG. 10 is a schematic diagram of a display anode and a backup anode corresponding to FIG. 6. In one or more embodiments, as shown in FIG. 9 and FIG. 10, the display anode 6 in the green sub-pixel region 15 and the display anode 6 in the blue sub-pixel region 16 are of a rhombus ring-shaped structure, and the display anode 6 surrounds the display cathode 7. Two vertex corners, arranged in the first direction, of the display anode in either of the green sub-pixel region 15 and the blue sub-pixel region 16 are first vertex corners 19, and the first vertex corners 19 respectively extend to two backup sub-display regions 5 which are adjacent to the display anode 6 in the first direction, and the first vertex corners 19 are reused as the backup anodes 9 of the two backup sub-pixel regions 5. In the configuration shown in FIG. 9, the backup sub-pixel region 5 adjacent to either of the green sub-pixel region 15 and the blue sub-pixel region 16 in the first direction is provided with two backup anodes 9, and the two backup anodes 9 are electrically connected to two display anodes 6, respectively. In the configuration shown in FIG. 10, one display anode 6 in the green sub-pixel region 15 or the display anode 6 in the blue sub-pixel region 16 is electrically connected to two backup anodes 9, respectively. In this arrangement manner, the first vertex corners 19 of the display anode 6 are directly reused as the backup anodes 9, and thus it is not necessary to provide additional backup anodes 9, simplifying the fabrication process. Moreover, the backup anode 9 and the display anode 6 are formed into one piece, and the reliability of the electrical connection between the backup anode 9 and the display anode 6 is also improved.

Taking FIG. 10 as an example, when the display anode 6 in the green sub-pixel region 15 and the display anode 6 in the blue sub-pixel region 16 are of a rhombus ring-shaped structure, the positive pin 12 of each of the green display light-emitting diode 11 and the blue display light-emitting diode 11 can include four positive sub-pins 20 which are connected, and the four positive sub-pins 20 surround the negative pin 13 (not show in FIG. 10), and the probability that the positive pin 12 is in contact with the display anode 6 during bonding is increased, improving the bonding success rate. In an embodiment, when the positive pin 12 of each of the green backup light-emitting diode 27 and the blue backup light-emitting diode 27 also includes four positive sub-pins 20 which are electrically connected, in order to arrange the bonding regions in order to arrange the bonding position reasonably, the bonding position of the backup light-emitting diode 27 is arranged inclined with respect to the bonding position of the display light-emitting diode 11 (the bonding position is as shown in the dotted box in FIG. 10).

In addition, the followings need to be noted. Please referring to FIG. 9 and FIG. 10 again, the display anode 6 in each of the green sub-pixel region 15 and the blue sub-pixel region 16 has two vertex corners arranged in the second direction, and the two vertex corners are referred to as second vertex corners 21, and the second vertex corners 21 are only located in the display sub-pixel regions 4 and do not extend into the backup sub-pixel regions 5, and the length of the display anode 6 in the second direction, avoiding the affecting to the bonding of the display light-emitting diodes 11 in other display sub-pixel regions 4. That is, a diagonal unit length of the display anode 6 with the rhombus ring-shaped structure in the first direction is larger than the length of the display sub-pixel region 4 (the display sub-pixel region 4 where the display anode 6 with the rhombus ring-shaped structure is located) in the first direction, and a diagonal unit length of the display anode 6 with the rhombus ring-shaped structure in the second direction is smaller than the length of the display sub-pixel region 4 in the second direction.

Figure 11:
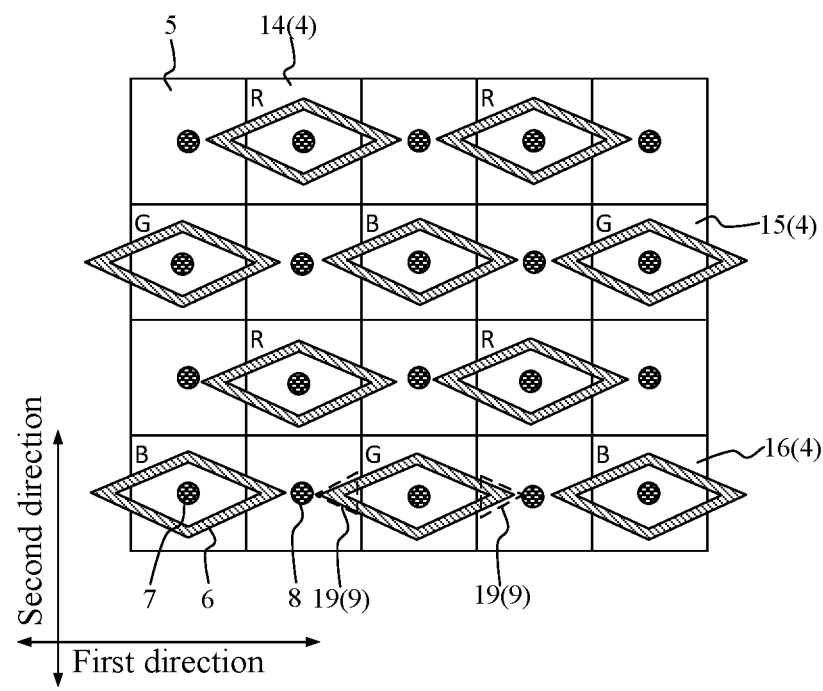
FIG. 11 is another schematic diagram of a display anode and a backup anode corresponding to FIG. 5.
Figure 12:
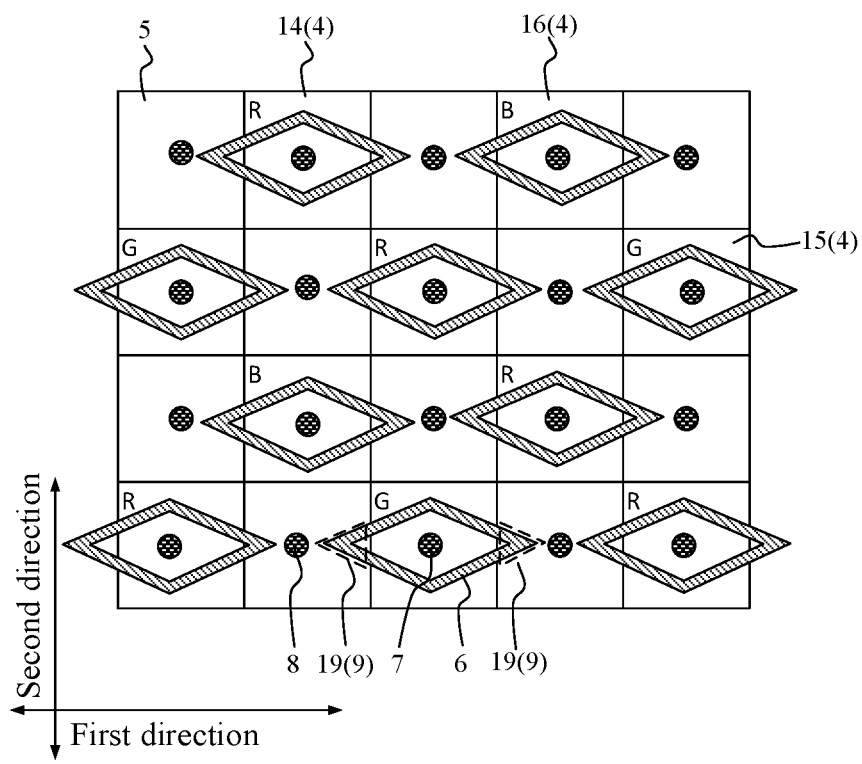
FIG. 12 is another schematic diagram of a display anode and a backup anode corresponding to FIG. 6.

FIG. 11 is another schematic diagram of a display anode and a backup anode corresponding to FIG. 5. FIG. 12 is another schematic diagram of a display anode and a backup anode corresponding to FIG. 6. In one or more embodiments, the display anode 6 in the red sub-pixel region 14, the display anode 6 in the green sub-pixel region 15, and the display anode 6 in the blue sub-pixel region 16 are all of a rhombus ring-shaped structure, and the display anode 6 surrounds the display cathode 7. Each display anode 6 has two vertex corners arranged in the first direction, which are referred to as first vertex corners 19 hereinafter. The first vertex corners 19 respectively extend to two backup sub-pixel regions 5 which are adjacent to the display anode 6 in the first direction, and the first vertex corner 19 are reused as the backup anodes 9 of the backup sub-pixel regions 5. In this arrangement manner, the first vertex corners 19 of the display anode 6 are directly reused as the backup anodes 9, and thus it does not need to provide additional backup anodes 9, simplifying the manufacturing process. Moreover, the backup anode 9 and the display anode 6 are formed into one piece, and the reliability of the electrical connection between the backup anode 9 and the display anode 6 is also improved. In addition, the first vertex corners 19 of each display anodes 6 are reused as the backup anodes 9 in the adjacent backup sub-pixel regions 5, that is, the display anode 6 of each display sub-pixel region 4 is electrically connected to two backup anodes 9, and each display light-emitting diode 11 corresponds to two bonding regions for two backup light-emitting diodes 27, improving the selection feasibility of the bonding position of the backup light-emitting diode 27.

In one or more embodiments, please referring to FIG. 7 and FIG. 8 again, the backup anode 9 in the backup sub-pixel region 5 is electrically connected to the display anode 6 in the display sub-pixel region 4 adjacent to the backup sub-pixel region 5, and the length of the connection wire between the backup anode 9 and the display anode 6 is reduced, reducing the signal transmission loss and layout complexity.

Figure 13:
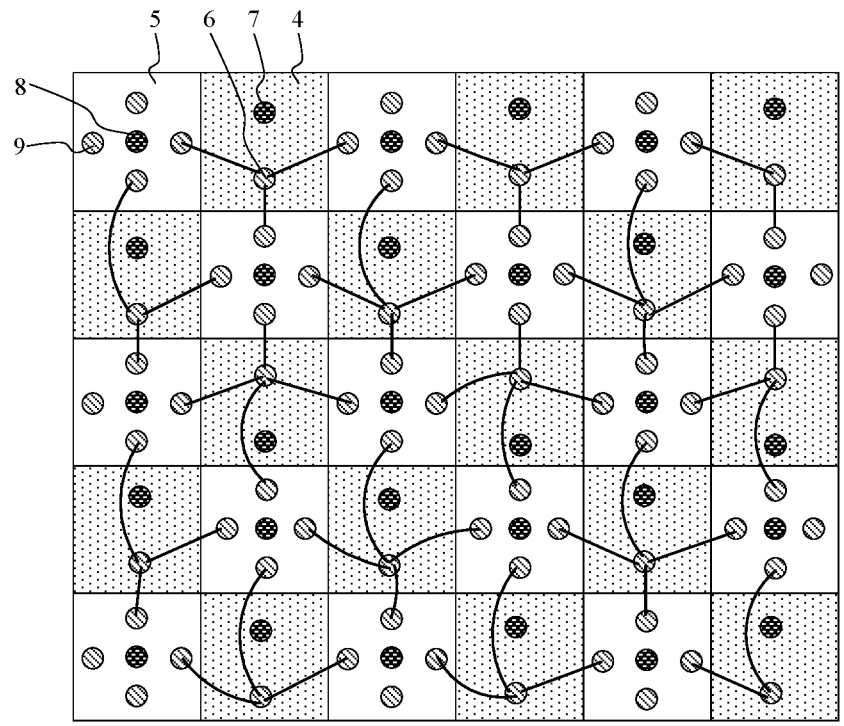
FIG. 13 is a schematic diagram showing connection of a display anode and a backup anode according to an embodiment of the present disclosure.
Figure 14:
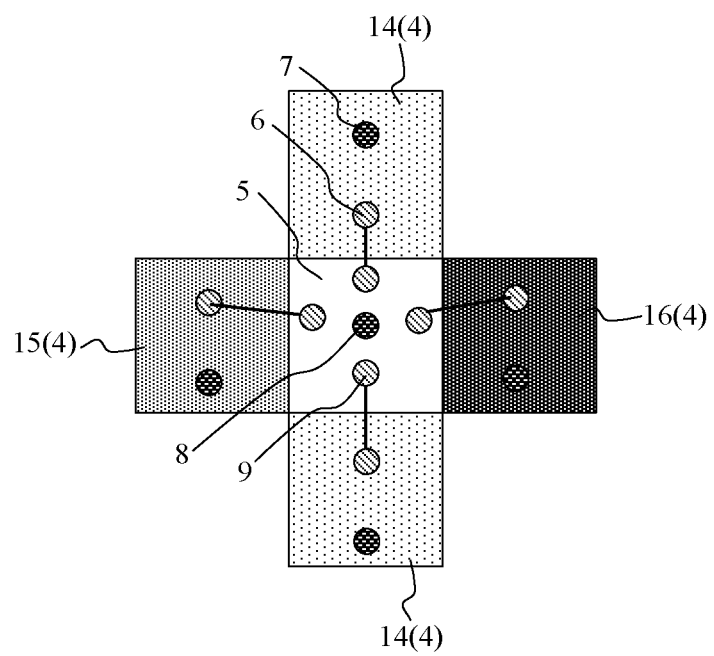
FIG. 14 is another schematic diagram showing connection of a display anode and a backup anode according to an embodiment of the present disclosure.

FIG. 13 is a schematic diagram showing connection of a display anode and a backup anode according to an embodiment of the present disclosure. In one or more embodiments, as shown in FIG. 13, the backup sub-pixel region 5 includes four backup anodes 9, and the four backup anodes 9 are electrically connected to the display anodes 6 in its four display sub-pixel regions 4 in one-to-one correspondence. In this case, bonding regions for four backup light-emitting diode 27 are formed in one backup sub-pixel region 5, and each display light-emitting diode 11 corresponds to four backup light-emitting diodes 27, improving the selection feasibility of the bonding position of the backup light-emitting diode 27 and improving the flexibility of the compensation manner.

Exemplarily, when the arrangement manner shown in FIG. 5 is adopted for the sub-pixel regions, as shown in FIG. 4, which is another schematic diagram showing connection of a display anode and a backup anode according to an embodiment of the present disclosure, the four backup anodes 9 in the backup sub-pixel region 5 are respectively connected to the backup anodes 6 of its neighboring red sub-pixel regions 14, the backup anode 6 of its neighboring green sub-pixel region 15 and the backup anode 6 of its neighboring blue sub-pixel region 16. In this case, one backup sub-pixel region 5 is formed with bonding regions for bonding two backup light-emitting diodes 27 which emit red light, a bonding region for bonding one backup light-emitting diode 27 that emits green light and a bonding region for bonding one backup light-emitting diode 27 that emits blue light, providing more backup schemes for bonding the backup light-emitting diode 27 in the backup sub-pixel region.

Further, please referring to FIG. 3 again, in order to facilitate the electrical connection between the backup anode 9 and the display anode 6 in the neighboring display sub-pixel region 4 and reduce the length of the connection wire, the four backup anodes 9 surround the backup cathode 8, and each of the backup anodes 9 is electrically connected to the display anode 6 in the closest display sub-pixel region 4.

Figure 15:
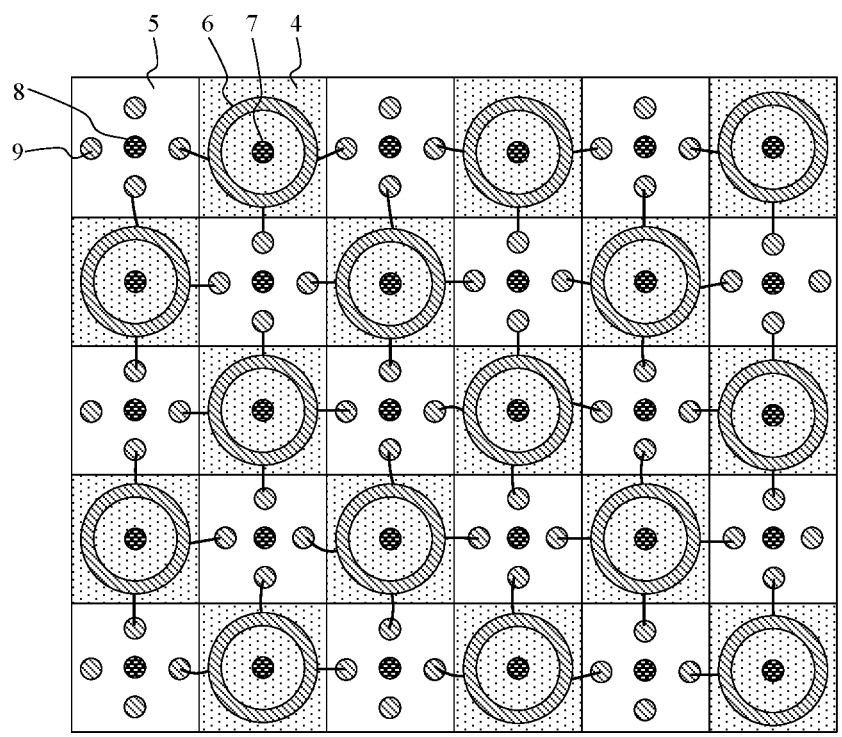
FIG. 15 is a schematic diagram of a display anode according to an embodiment of the present disclosure.

FIG. 15 is a schematic diagram of a display anode according to an embodiment of the present disclosure. In one or more embodiments, as shown in FIG. 15, in order to further facilitate the electrical connection between the backup anode 9 and the display anode 6, the display anode 6 is of a ring-shaped structure, and the display anode 6 surrounds the display cathode 7.

Figure 16:
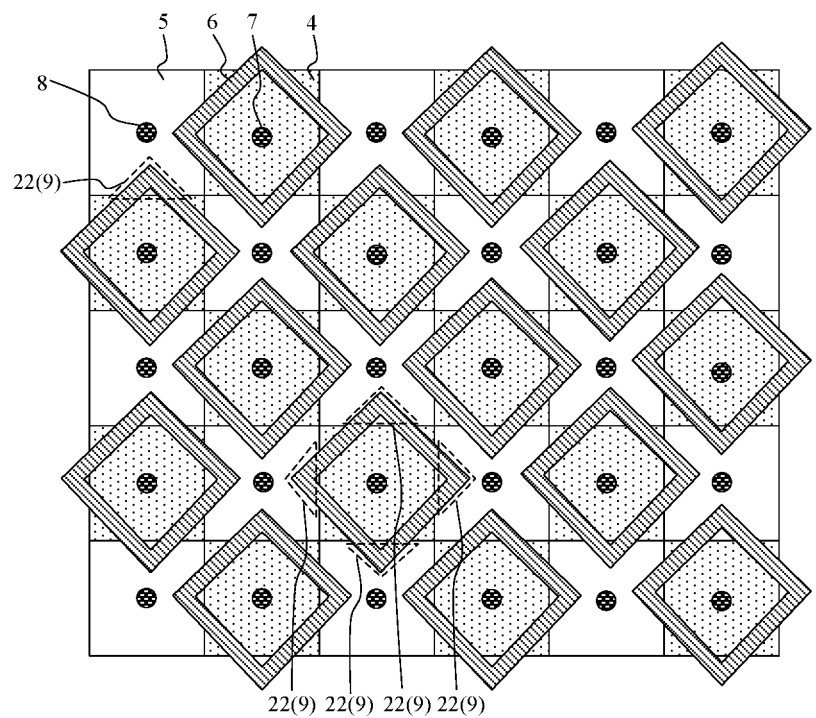
FIG. 16 is another schematic diagram of a display anode according to an embodiment of the present disclosure.

FIG. 16 is another schematic diagram of a display anode according to an embodiment of the present disclosure. In one or more embodiments, as shown in FIG. 16, the display anode 6 is of a quadrilateral ring-shaped structure, and the display anode 6 surrounds the display cathode 7. Four vertex corners 22 of the display anode 6 respectively extend into four neighboring backup sub-pixel regions 5 and are reused as the backup anodes 9 of the four neighboring backup sub-pixel regions 5. In this case, it does not need to additionally provide the backup anode 9, simplifying the manufacturing process. In addition, the backup anode 9 and the display anode 6 are formed into one piece, improving the reliability of electrical connection between the backup anode 9 and the display anode 6.

Figure 17:
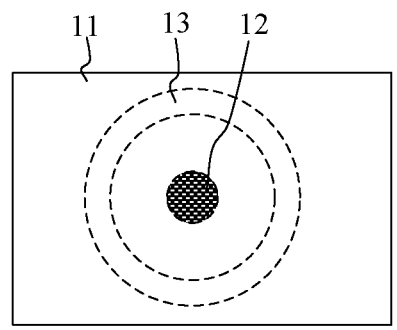
FIG. 17 is a top view of a display light-emitting diode according to an embodiment of the present disclosure.
Figure 18:
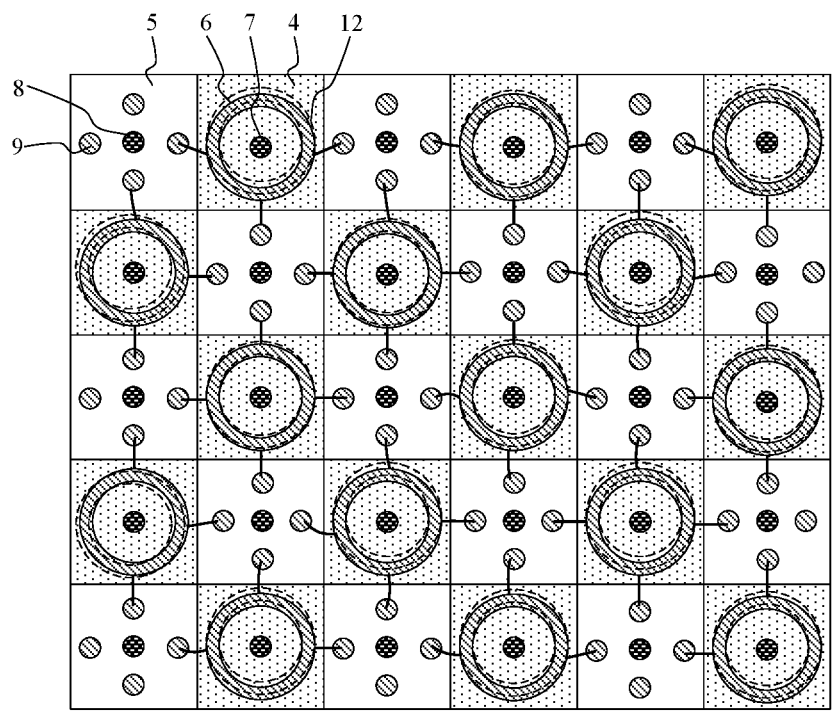
FIG. 18 is a schematic diagram showing bonding of a positive pin and a display anode according to an embodiment of the present disclosure.

FIG. 17 is a top view of a display light-emitting diode according to an embodiment of the present disclosure. FIG. 18 is a schematic diagram showing bonding of a positive pin and a display anode according to an embodiment of the present disclosure. In one or more embodiments, as shown in FIG. 17 and FIG. 18, the positive pin 12 of the display light-emitting diode 11 is of a ring-shaped structure, and the positive pin 12 surrounds the negative pin 13, and the probability that the positive pin 12 is in contact with the display anode 6 during bonding is increased, and the bonding success rate is improved.

Figure 19:
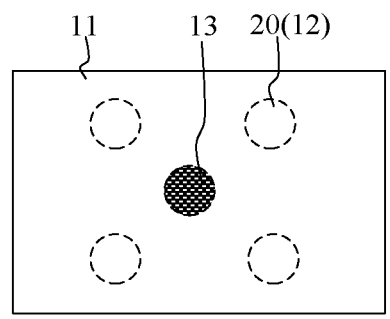
FIG. 19 is another top view of a display light-emitting diode according to an embodiment of the present disclosure.
Figure 20:
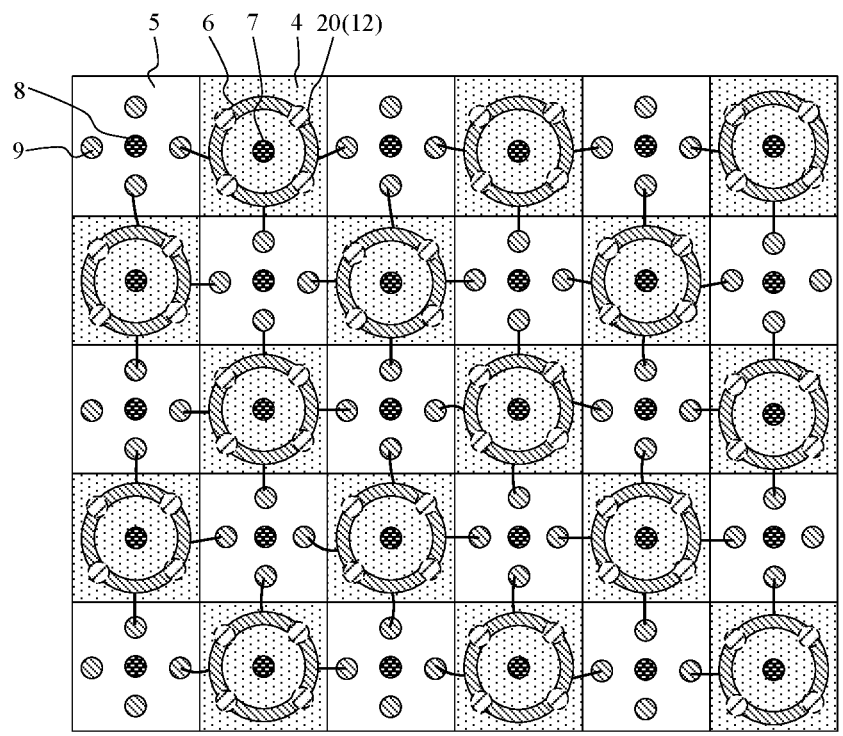
FIG. 20 is a schematic diagram showing another bonding of a positive pin and a display anode according to an embodiment of the present disclosure.

FIG. 19 is another top view of a display light-emitting diode according to an embodiment of the present disclosure. FIG. 20 is a schematic diagram showing another bonding of a positive pin and a display anode according to an embodiment of the present disclosure. In an alternative embodiment, the positive pin 12 of the display light-emitting diode 11 includes a plurality of positive sub-pins 20, and the plurality of positive sub-pins 20 surround the negative pin 13, and the probability that the positive pin 12 is in contact with the display anode 6 during bonding is increased, and the bonding success rate is improved.

Further, with reference to FIG. 10, when the display anode 6 is of a rhombus ring-shaped structure, the positive pin 12 of the backup light-emitting diode can be configured in the same manner as the positive pin 12 of the display light-emitting diode 11. That is, the positive pin 12 of the backup light-emitting diode includes a plurality of positive sub-pins 20 which surround the negative pin 13. In this case, it just needs to adjust the bonding position of the backup light-emitting diode when bonding the backup light-emitting diode, and thus the backup light-emitting diode can be bonded to the backup anode 9. In this way, it does not need to separately fabricate the backup light-emitting diode and the display light-emitting diode 11, and the backup light-emitting diode and the display light-emitting diode 11 can be fabricated simultaneously, simplifying the manufacturing process of the light-emitting diodes. Moreover, during the bonding and alignment of the display light-emitting diode 11 and the backup light-emitting diode, the above arrangement further can improve the accuracy of the bonding and alignment of the positive pin 12.

In addition, it needs to be noted that, based on the above structures of the display anode 6 and the positive pin 12, when the structures are adopted in the arrangement manner of the backup sub-pixel regions 5 shown in FIG. 8, since one backup sub-pixel region 5 is only provided with the bonding region of the backup light-emitting diode that emits green light or the backup light-emitting diode that emits blue light, the positive pin 12 of the backup light-emitting diode will not be aligned to the backup anode 9 of other color light-emitting diodes during the bonding and alignment of the backup light-emitting diode, and thus the bonding error is avoided.

In an alternative embodiment, as shown in FIG. 7, the backup anode 9 and the backup cathode 8 are not provided in at least one of the backup sub-pixel regions 5, reducing the quantity of the backup anode 9 and the backup cathode 8 and reducing the manufacturing cost.

Figure 21:
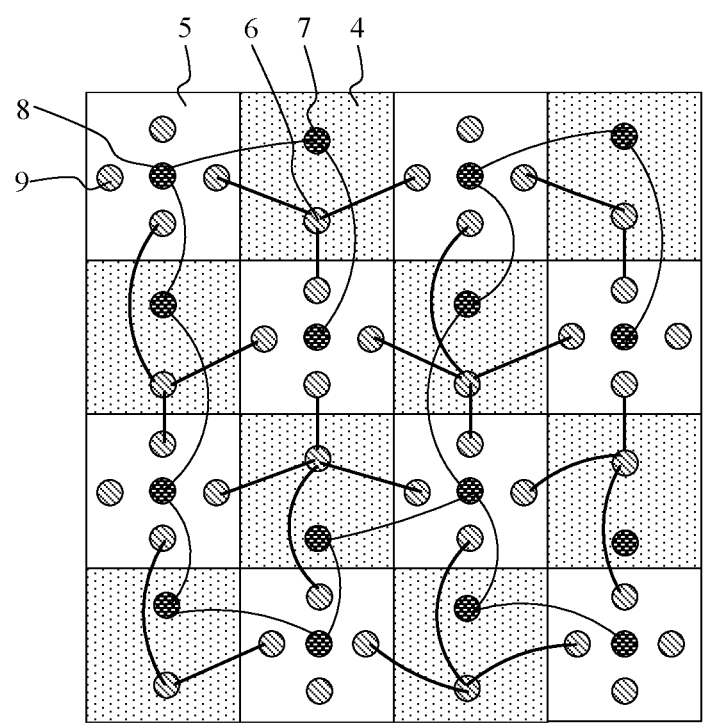
FIG. 21 is a schematic diagram showing connection of a display cathode and a backup cathode according to an embodiment of the present disclosure.

FIG. 21 is a schematic diagram showing connection of a display cathode and a backup cathode according to an embodiment of the present disclosure. In one or more embodiments, as shown in FIG. 21, the display cathode 7 is electrically connected to at least two backup cathodes 8 in different backup sub-pixel regions 5, and thus the display cathode 7 can transmit a cathode signal to the backup cathodes 8 that are electrically connected to the display cathode 7. When a backup light-emitting diode 27 is bonded to the backup cathode 8, the backup light-emitting diode 27 can be driven to emit light normally. In an embodiment, the backup cathode 8 is not electrically connected to the display cathode 7, but is electrically connected, via a signal transmission line, to a device providing the cathode signal.

In an embodiment, please referring to FIG. 4 again, the array substrate 1 includes a substrate 28 and a driver circuit 23 disposed on the substrate 28. The driver circuit 23 includes an active layer 24, a gate layer 25 and a source-drain layer 26 which are sequentially stacked in a light-emitting direction of the display panel. The source-drain layer 26 is electrically connected to the display anode 6. A driving current supplied by the driver circuit is transmitted to the display anode 6 via the source-drain layer 26 and the display light-emitting diode 11 is driven to emit light. The backup anode 9, the backup cathode 8, the display anode 6, and the display cathode 7 are located in a same layer, and the backup anode 9, the backup cathode 8, the display anode 6, and the display cathode 7 are located on a side of source-drain layer 26 facing away from the substrate. In this case, the backup anode 9 and the backup cathode 8 can be formed with the display anode 6 and the display cathode 7 through a same patterning process. It does not need to adopt an additional patterning process to form the backup anode 9 and the backup cathode 8, and an additional film thickness is not required, simplifying the process flow and being more favorable to the downsizing and thinning of the display panel.

In an alternative embodiment, please referring to FIG. 2 and FIG. 4 again, the light-emitting diodes 10 further include backup light-emitting diodes 27. The backup light-emitting diodes 27 are disposed in the backup sub-pixel regions 5. A positive pin 12 of the backup light-emitting diode 27 is bonded to the backup anode 9 in the backup sub-pixel region 5, and a negative pin 13 of the backup light-emitting diode 27 is bonded to the backup cathode 8 in the backup sub-pixel region 5, and the compensation for the emission brightness of the display light-emitting diode 11 incapable of emitting light is achieved, and the display performance is optimized.

Figure 22:
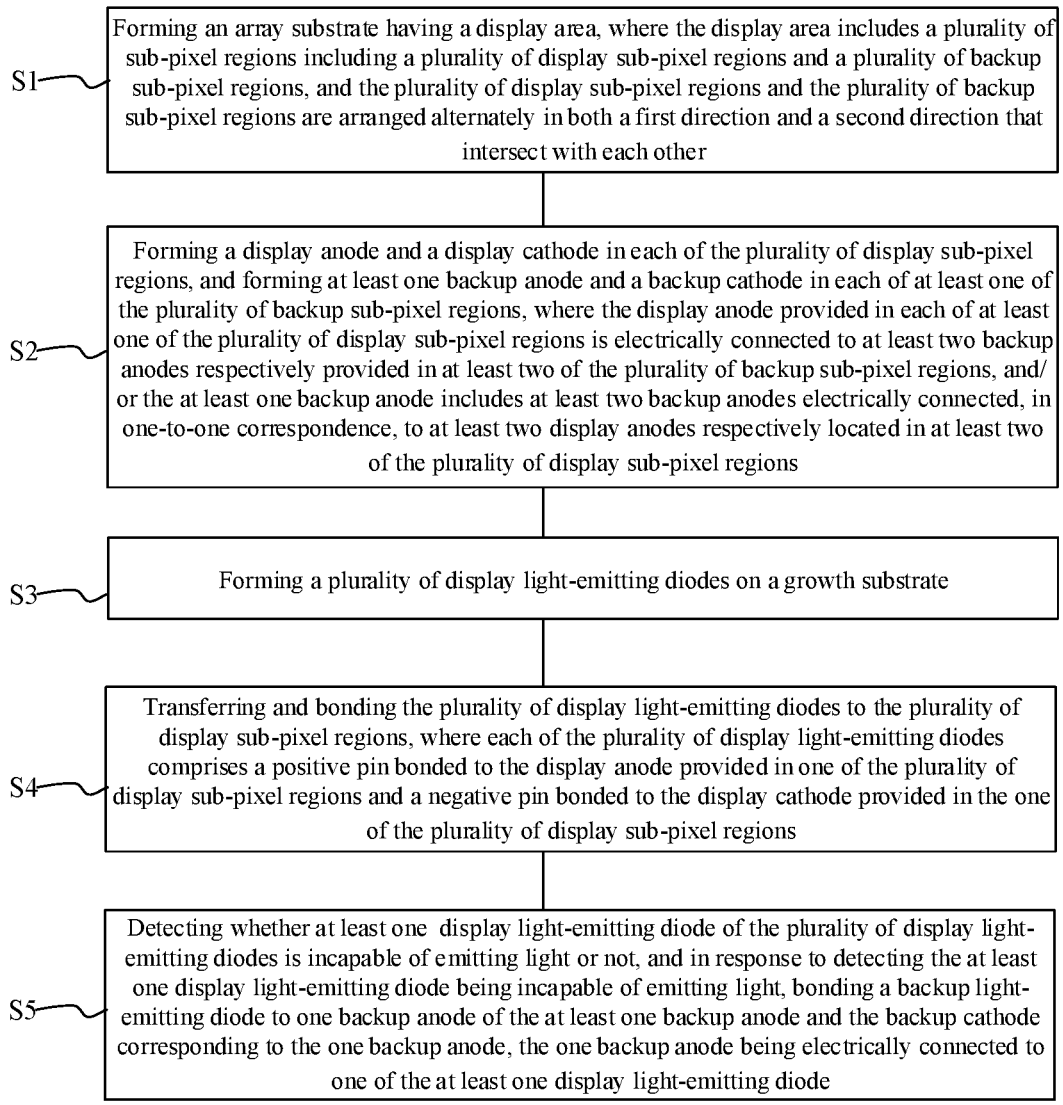
FIG. 22 is a flowchart of a manufacturing method according to an embodiment of the present disclosure.

An embodiment of the present disclosure further provides a manufacturing method of a display panel. FIG. 22 is a flowchart of the manufacturing method according to an embodiment of the present disclosure. With reference to FIG. 2 to FIG. 4 and FIG. 22, the manufacturing method includes the following steps.

At step S1, an array substrate 1 is formed. A display area 2 of the array substrate 1 includes a plurality of sub-pixel regions 3, each of the plurality of sub-pixel regions 3 includes a display sub-pixel region 4 and a backup sub-pixel region 5. The display sub-pixel regions 4 and the backup sub-display regions 5 are alternately arranged in both a first direction and a second direction, and the first direction intersects with the second direction.

At step S2, a display anode 6 and a display cathode 7 are disposed in the display sub-pixel region 4, and a backup anode 9 and a backup cathode 8 are disposed in at least one of the backup sub-pixel regions 5. The display anode 6 of at least one of the display sub-pixel regions 4 is electrically to the backup anodes 9 of at least two backup sub-pixel regions 5, and/or, at least one of the backup sub-pixel regions 5 is provided with at least two backup anodes 9 and the at least two backup anodes 9 are respectively connected to the display anodes 6 in at least two display sub-pixel regions in one-to-one correspondence.

In an embodiment, one display anode 6 and one display cathode 7 are disposed in the display sub-pixel region 4, and the display anode 6 and the display cathode 7 constitute a bonding region for one display light-emitting diode 11. Only one backup cathode 8 is provided in the backup sub-pixel region 5. When one backup anode 9 is disposed in the backup sub-pixel region 5, the backup anode 9 and the backup cathode 8 constitute a bonding region for one backup light-emitting diode 27. When the backup sub-pixel region 5 is provided with at least two backup anodes 9 therein, the backup cathode 8 serves as the common backup cathode of the at least two backup anodes 9. Each backup anode 9 and the backup cathode 8 constitute a bonding region for one backup light-emitting diode 27.

At step S3, display light-emitting diodes 11 are formed on a growth substrate.

At step S4, the display light-emitting diodes 11 are transferred and bonded to the display sub-pixel regions 4 of the array substrate 1, where a positive pin 12 of the display light-emitting diode 11 is bonded to the display anode 6, and a negative pin 13 of the display light-emitting diode 11 is bonded to the display cathode 7.

At step S5, it is detected, from the display light-emitting diodes 11, at least one display light-emitting diode 11 that is incapable of emitting light, and in response to detecting the display light-emitting diode 11 incapable of emitting light, a backup light-emitting diode 27 is bonded to the backup anode 9 that is electrically connected to the display light-emitting diode 11 incapable of emitting light and the backup cathode 8 corresponding to the backup anode 9.

By adopting the manufacturing method provided by the embodiment of the present disclosure, based on the arrangement manner of the display sub-pixel regions 4 and the backup sub-pixel regions 5 in the array substrate 1, the backup sub-pixel regions 5 are arranged with intervals in the display area 2, effectively improving a dark line problem caused by a continuous distribution of the backup sub-pixel regions 5 and improving the display uniformity. Moreover, in the case where the display anode 6 of at least one of the display sub-pixel regions 4 is electrically connected to the backup anodes 9 of at least two backup sub-pixel regions 5, when a certain display light-emitting diode 11 is incapable of emitting light, it is feasible to select one bonding region from the corresponding bonding regions of the backup light-emitting diode 27 for bonding the backup light-emitting diode 27 therein; or it is feasible to bond a backup light-emitting diode 27 in each of the corresponding bonding regions, improving the selection feasibility of the bonding position of the backup light-emitting diode 27. In an embodiment, when at least one of the backup sub-pixel regions 5 is provided with at least two backup anodes 9 and the at least two backup anodes 9 are connected to the display anodes 6 of at least two display sub-pixels in one-to-one correspondence, bonding regions for at least two backup light-emitting diodes 27 can be formed in each of the at least one of backup sub-pixel regions 5, and one backup sub-pixel region 5 can selectively compensate any one of the at least two display light-emitting diodes 11, making the compensation manner more flexible.

Figure 23:
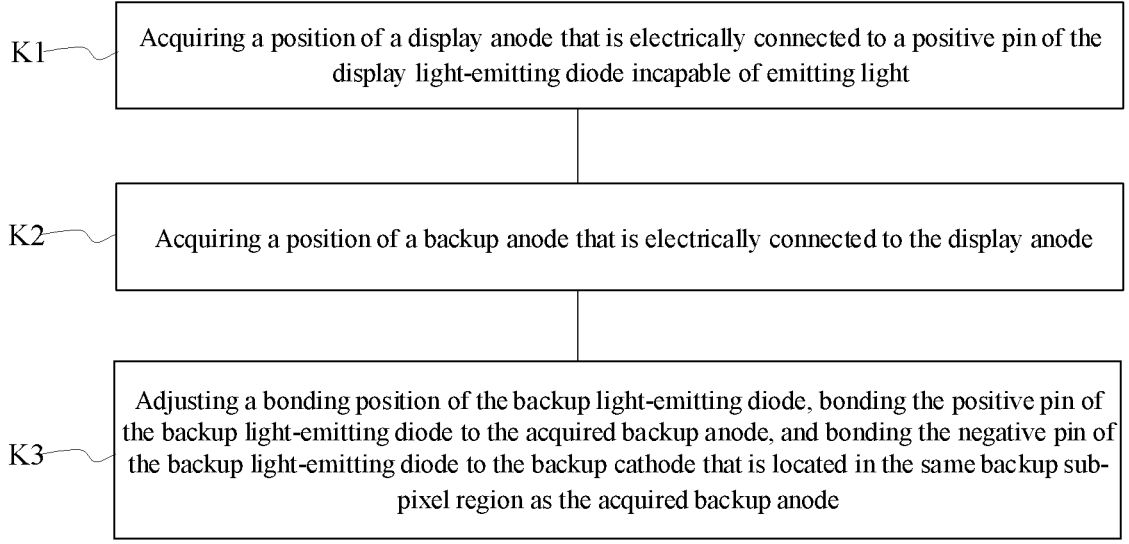
FIG. 23 is a flowchart of another manufacturing method according to an embodiment of the present disclosure.

Further, when a display light-emitting diode 11 that is unable to emit light is detected, in order to accurately bond the backup light-emitting diode 27 in the bonding region of the backup light-emitting diode 27 corresponding to the display light-emitting diode 11 incapable of emitting light, as shown in FIG. 23, which is a flowchart of another manufacturing method according to an embodiment of the present disclosure, the step S5 of bonding a backup light-emitting diode 27 to the backup anode 9 that is electrically connected to the display light-emitting diode 11 incapable of emitting light and the backup cathode 8 corresponding to the backup anode 9 can include the following steps.

At step K1, a position of the display anode 6 that is electrically connected to the positive pin 12 of the display light-emitting diode 11 incapable of emitting light is acquired.

At step K2, a position of the backup anode 9 that is electrically connected to the display anode 6 is acquired.

At step K3, a bonding position of the backup light-emitting diode 27 is adjusted, the positive pin 12 of the backup light-emitting diode 27 is bonded to the acquired backup anode 9, and the negative pin 13 of the backup light-emitting diode 27 is bonded to the backup cathode 8 that is located in the same backup sub-pixel region 5 as the acquired backup anode 9.

Figure 24:
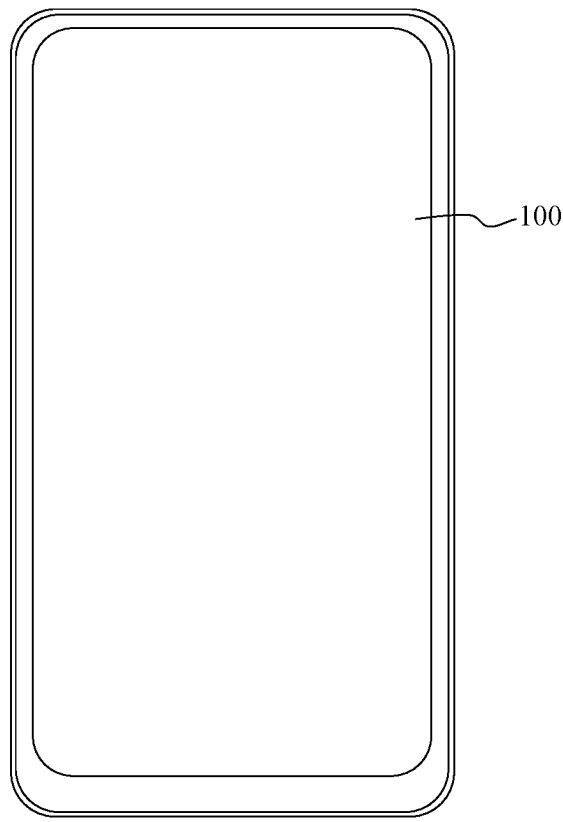
FIG. 24 is a schematic diagram of a display apparatus according to an embodiment of the present disclosure.

An embodiment of the present disclosure further provides a display apparatus. FIG. 24 is a schematic diagram of a display apparatus according to an embodiment of the present disclosure. As shown in FIG. 24, the display apparatus includes the above display panel 100. The structure of the display panel 100 has been described in details in the above embodiments, and is not repeated herein. Of course, the display apparatus shown in FIG. 24 is merely for illustration. The display apparatus can be any electronic apparatus having a display function such as a mobile phone, a tablet computer, a notebook computer, an electronic paper book, or a television.

Since the display apparatus provided by the embodiment of the present disclosure includes the above display panel 100, the display apparatus can effectively reduce the dark line problem caused by a continuous distribution of the backup sub-pixel regions 5, improve the display uniformity, and optimize the display effect. In addition, the display apparatus can also improve the selection feasibility of the bonding position of the backup light-emitting diodes 27 and improves the feasibility of the compensation manner.

The embodiments described above are merely exemplary embodiments of the present disclosure, but not intended to limit the present disclosure. Any modifications, equivalent substitutions, improvements, etc., which fall within the spirit and principles of the present disclosure, should be included in the protection scope of the present disclosure.

What is claimed is:

1. A display panel, comprising:
    an array substrate having a display area, wherein the display area comprises a plurality of sub-pixel regions comprising a plurality of display sub-pixel regions and a plurality of backup sub-pixel regions, and the plurality of display sub-pixel regions and the plurality of backup sub-pixel regions are arranged alternately in both a first direction and a second direction that intersect with each other; a display anode and a display cathode are provided in each of the plurality of display sub-pixel regions, and at least one backup anode and a backup cathode are provided in each of at least one of the plurality of backup sub-pixel regions; and the display anode provided in each of at least one of the plurality of display sub-pixel regions is electrically connected to at least two backup anodes respectively provided in at least two of the plurality of backup sub-pixel regions, and/or the at least one backup anode comprises at least two backup anodes electrically connected, in one-to-one correspondence, to at least two display anodes respectively located in at least two of the plurality of display sub-pixel regions; and
    a plurality of light-emitting diodes comprising a plurality of display light-emitting diodes, wherein the plurality of display light-emitting diodes is in one-to-one correspondence with the plurality of display sub-pixel regions, and each of the plurality of display light-emitting diodes comprises a positive pin bonded to the display anode provided in one display sub-pixel region of the plurality of display sub-pixel regions corresponding to the display light-emitting diode, and a negative pin bonded to the display cathode provided in the one display sub-pixel region.

2. The display panel according to claim 1, wherein the plurality of display sub-pixel regions comprises a plurality of red sub-pixel regions, a plurality of green sub-pixel regions and a plurality of blue sub-pixel regions,
    wherein the plurality of sub-pixel regions forms a plurality of sub-pixel region groups arranged in the second direction, each of the plurality of sub-pixel region groups comprises at least two sub-pixel regions of the plurality of sub-pixel regions arranged along the first direction; and
    wherein at least one of the plurality of red sub-pixel regions is arranged in a $(2n-1)^{th}$ sub-pixel region group of the plurality of sub-pixel region groups, and at least two of the plurality of green sub-pixel regions and at least two of the plurality of blue sub-pixel regions are alternately arranged in a (2n)$^{th}$ sub-pixel region group of the plurality of sub-pixel region groups, where n is an integer greater than or equal to 1; or, wherein at least two of the plurality of blue sub-pixel regions and at least two of the plurality of red sub-pixel regions are alternately arranged in a (2n−1)$^{th}$ sub-pixel region group of the plurality of sub-pixel region groups, and at least two of the plurality of green sub-pixel regions and at least two of the plurality of red sub-pixel regions are alternately arranged in a (2n)$^{th}$ sub-pixel region group of the plurality of sub-pixel region groups, where n is an integer greater than or equal to 1.

3. The display panel according to claim 2, wherein each of the at least one backup anode is only electrically connected to the display anode provided in one of the plurality of green sub-pixel regions or the display anode provided in one of the plurality of blue sub-pixel regions, wherein the backup anode electrically connected to the display anode of one of the plurality of green sub-pixel regions is located in one of the plurality of backup sub-pixel regions adjacent to the green sub-pixel region in the first direction, and the backup anode electrically connected to the display anode provided in one of the plurality of blue sub-pixel regions is located in one of the plurality of backup sub-pixel regions adjacent to the blue sub-pixel region in the first direction.

4. The display panel according to claim 3, wherein the display anode in each display sub-pixel region of the plurality of green sub-pixel regions and the plurality of blue sub-pixel regions is of a rhombus ring-shaped structure surrounding the display cathode in the display sub-pixel region, and has two first vertex corners arranged in the first direction, wherein the two first vertex corners respectively extend to two backup sub-pixel regions that are adjacent to the display anode in the first direction, and the two first vertex corners are respectively reused as two backup anodes located in the two backup sub-pixel regions.

5. The display panel according to claim 2, wherein the display anode in each display sub-pixel region of the plurality of red sub-pixel regions, the plurality of green sub-pixel regions and the plurality of blue sub-pixel regions is of a rhombus ring-shaped structure surrounding the display cathode in the display sub-pixel region, and has two first vertex corners arranged in the first direction, wherein the two first vertex corners respectively extend to two backup sub-pixel regions that are adjacent to the display anode in the first direction, and the two first vertex corners are respectively reused as two backup anode provided in the two backup sub-pixel regions.

6. The display panel according to claim 1, wherein one of the at least one backup anode is electrically connected to the display anode provided in one of the plurality of display sub-pixel regions adjacent to the backup anode.

7. The display panel according to claim 1, wherein the at least one backup anode comprises four backup anodes, and the four backup anodes are electrically connected, in one-to-one correspondence, to four display anodes respectively provided in four display sub-pixel regions of the plurality of display sub-pixel regions adjacent to the four backup anodes.

8. The display panel according to claim 7, wherein the four backup anodes surround the backup cathode in the backup sub-pixel region where the four backup anodes is located, each of the four backup anodes is electrically connected to one of the four the display anodes that is located in one of the four display sub-pixel regions closest to the backup anode.

9. The display panel according to claim 7, wherein the display anode is of a ring-shaped structure surrounding the display cathode.

10. The display panel according to claim 9, wherein the display anode is of a quadrilateral ring-shaped structure surrounding the display cathode and comprising four vertex corners, wherein the four vertex corners respectively extend to four backup sub-pixel regions of the plurality of backup sub-pixel regions adjacent to the display anode and are respectively reused as four backup anode respectively located in the four backup sub-pixel regions.

11. The display panel according to claim 10, wherein the positive pin is of a ring-shaped structure surrounding the negative pin.

12. The display panel according to claim 10, wherein the positive pin comprises a plurality of positive sub-pins surrounding the negative pin.

13. The display panel according to claim 1, wherein at least one of the plurality of backup sub-pixel regions is provided with no backup anode and no backup cathode.

14. The display panel according to claim 1, wherein the display cathode is electrically connected to at least two backup cathodes respectively located in different backup sub-pixel regions of the plurality of backup sub-pixel regions.

15. The display panel according to claim 1, wherein the array substrate comprises a substrate and a driver circuit arranged on the substrate, wherein the driver circuit comprises an active layer, a gate layer and a source-drain layer that are sequentially arranged along an light-exiting direction of the display panel; and the at least one backup anode, the backup cathode, the display anode, and the display cathode are located in a same layer and are located at a side of source-drain layer facing away from the substrate.

16. The display panel according to claim 1, wherein the plurality of light-emitting diodes further comprises a plurality of backup light-emitting diodes located in the plurality of backup sub-pixel regions, wherein each of the plurality of backup light-emitting diodes comprises a positive pin bonded to one of the at least one backup anode provided in one of the plurality of backup sub-pixel regions and a negative pin bonded to the backup cathode provided in the one of the plurality of backup sub-pixel regions.

17. A manufacturing method of a display panel, comprising:

forming an array substrate having a display area, wherein the display area comprises a plurality of sub-pixel regions comprising a plurality of display sub-pixel regions and a plurality of backup sub-pixel regions, and the plurality of display sub-pixel regions and the plurality of backup sub-pixel regions are arranged alternately in both a first direction and a second direction that intersect with each other;

forming a display anode and a display cathode in each of the plurality of display sub-pixel regions, and forming at least one backup anode and a backup cathode in each of at least one of the plurality of backup sub-pixel regions, wherein the display anode provided in each of at least one of the plurality of display sub-pixel regions is electrically connected to at least two backup anodes respectively provided in at least two of the plurality of backup sub-pixel regions, and/or the at least one backup anode comprises at least two backup anodes electrically connected, in one-to-one correspondence, to at least two display anodes respectively located in at least two of the plurality of display sub-pixel regions;

forming a plurality of display light-emitting diodes on a growth substrate;

transferring and bonding the plurality of display light-emitting diodes to the plurality of display sub-pixel regions, wherein each of the plurality of display light-emitting diodes comprises a positive pin bonded to the display anode provided in one of the plurality of display sub-pixel regions and a negative pin bonded to the display cathode provided in the one of the plurality of display sub-pixel regions; and detecting whether at least one display light-emitting diode of the plurality of display light-emitting diodes is incapable of emitting light or not, and in response to detecting the at least one display light-emitting diode being incapable of emitting light, bonding a backup light-emitting diode to one backup anode of the at least one backup anode and the backup cathode corresponding to the one backup anode, the one backup anode being electrically connected to one of the at least one display light-emitting diode.

18. The manufacturing method according to claim 17, wherein said bonding the backup light-emitting diode to the one backup anode electrically connected to one of the at least one display light-emitting diode and the backup cathode corresponding to the one backup anode comprises:

acquiring a position of the one backup anode that is electrically connected to the positive pin of the one of the at least one display light-emitting diode;

acquiring a position of the backup anode that is electrically connected to the one of the at least one display anode; and adjusting a bonding position of the backup light-emitting diode, bonding a positive pin of the backup light-emitting diode to the acquired backup anode, and bonding a negative pin of the backup light-emitting diode to the backup cathode that is located in a backup sub-pixel region where the acquired backup anode is located.

19. A display apparatus, comprising:

a display panel, wherein the display panel comprises:

an array substrate having a display area, wherein the display area comprises a plurality of sub-pixel regions comprising a plurality of display sub-pixel regions and a plurality of backup sub-pixel regions, and the plurality of display sub-pixel regions and the plurality of backup sub-pixel regions are arranged alternately in both a first direction and a second direction that intersect with each other; a display anode and a display cathode are provided in each of the plurality of display sub-pixel regions, and at least one backup anode and a backup cathode are provided in each of at least one of the plurality of backup sub-pixel regions; and the display anode provided in each of at least one of the plurality of display sub-pixel regions is electrically connected to at least two backup anodes respectively provided in at least two of the plurality of backup sub-pixel regions, and/or the at least one backup anode comprises at least two backup anodes electrically connected, in one-to-one correspondence, to at least two display anodes respectively located in at least two of the plurality of display sub-pixel regions; and a plurality of light-emitting diodes comprising a plurality of display light-emitting diodes, wherein the plurality of display light-emitting diodes is in one-to-one correspondence with the plurality of display sub-pixel regions, and each of the plurality of display light-emitting diodes comprises a positive pin bonded to the display anode provided in one display sub-pixel region of the plurality of display sub-pixel regions corresponding to the display light-emitting diode, and a negative pin bonded to the display cathode provided in the one display sub-pixel region.

* * * * *